(12) United States Patent
Wang et al.

(10) Patent No.: US 11,954,061 B2
(45) Date of Patent: Apr. 9, 2024

(54) MAPPING METHOD AND MAPPING DEVICE FOR RECONFIGURABLE ARRAY

(71) Applicant: Beijing Tsingmicro Intelligent Technology Co., Ltd., Beijing (CN)

(72) Inventors: Chongyang Wang, Beijing (CN); Zhen Zhang, Beijing (CN); Peng Ouyang, Beijing (CN)

(73) Assignee: BEIJING TSINGMICRO INTELLIGENT TECHNOLOGY CO., LTD., Beijing (CN)

( * ) Notice: Subject to any disclaimer, the term of this patent is extended or adjusted under 35 U.S.C. 154(b) by 448 days.

(21) Appl. No.: 17/483,188

(22) Filed: Sep. 23, 2021

(65) Prior Publication Data
US 2022/0083495 A1 Mar. 17, 2022

Related U.S. Application Data

(63) Continuation of application No. PCT/CN2021/073394, filed on Jan. 22, 2021.

(30) Foreign Application Priority Data

Sep. 17, 2020 (CN) .......................... 202010983700.2

(51) Int. Cl.
*G06F 9/50* (2006.01)
*G06F 8/41* (2018.01)
*G06F 15/177* (2006.01)
*G06F 30/34* (2020.01)

(52) U.S. Cl.
CPC ............ *G06F 15/177* (2013.01); *G06F 8/451* (2013.01); *G06F 8/457* (2013.01); *G06F 9/5066* (2013.01); *G06F 30/34* (2020.01); *G06F 2209/5017* (2013.01); *G06F 2209/506* (2013.01)

(58) Field of Classification Search
CPC ........ G06F 8/451; G06F 8/457; G06F 9/5066; G06F 30/34; G06F 2209/5017; G06F 2209/506
See application file for complete search history.

(56) References Cited

U.S. PATENT DOCUMENTS

2011/0314441 A1* 12/2011 Lee .......................... G06F 17/10
717/105

OTHER PUBLICATIONS

Sébastien Briais, Ensuring Lexicographic-Positive Data Dependence Graphs in the SIRA Framework, Feb. 2010, Universite de Versailles Saint-Quentin en Yvelines (Year: 2010).*

(Continued)

*Primary Examiner* — Dong U Kim
(74) *Attorney, Agent, or Firm* — Hodgson Russ LLP

(57) ABSTRACT

A mapping method for a reconfigurable array, including: Si obtaining and analyzing a DDG; providing an initial interval; obtaining a reconfigurable architecture; copying the first adjacency matrix and the second adjacency matrix to form a mapping space; establishing an integer linear programming model, and mapping, with the integer linear programming model, a processing vertex, an intra-cycle edge, and an inter-cycle edge in the DDG, to the mapping space, respectively; obtaining a mapping relationship from the processing vertex and the edge in the DDG to the processing element and the link of extended TS_max layers; and generating configuration information by the mapping relationship modulo the initial interval.

8 Claims, 4 Drawing Sheets

(56) References Cited

OTHER PUBLICATIONS

Sid-Ahmed-Ali Touati, EquiMax: A New Formulation of Acyclic Scheduling Problem for ILP Processors, Nov. 9, 2000 (Year: 2000).*
Tomi Aijo, Integer Linear Programming-Based Scheduling for Transport Triggered Architectures, Dec. 2015, ACM (Year: 2015).*

* cited by examiner

MAPPING METHOD AND MAPPING DEVICE FOR RECONFIGURABLE ARRAY

CROSS-REFERENCE TO RELATED APPLICATION

This application is a continuation of International Application No. PCT/CN2021/073394, filed with the National Intellectual Property Administration of P. R. China on Jan. 22, 2021, which claims priority to and benefits of Chinese Patent Application Serial No. 202010983700.2, filed with the National Intellectual Property Administration of P. R. China on Sep. 17, 2020, the entire content of which is incorporated herein by reference.

FIELD

The present disclosure relates to a field of reconfigurable arrays, and more particularly to a mapping method and a mapping device for a reconfigurable array.

BACKGROUND

A coarse-grained reconfigurable architecture (CGRA), also known as a reconfigurable architecture, has a great potential to be applied in computationally intensive tasks. The CGRA has a performance substantially the same to that of an application-specific integrated circuit (ASIC) and keeps its hardware programmability at the same time.

The CGRA is generally composed of multiple processing elements (PEs), which perform functions, such as addition and multiplication, similar to an arithmetic logic unit (ALU). In different CGRAs, different PE functions may be required, and thus interconnection modes of the PEs may be different. The PEs of the CGRA may be arranged for different functions according to different requirements by a user.

In practical applications, a compiler needs to convert a language program written by the user into a data dependence graph (DDG) which is in a data flow form. The DDG includes vertexes and edges which indicate dependencies of the data. The vertexes and the edges of the DDG are mapped onto a hardware architecture of the CGRA, and the mapping may include operations such as scheduling, corresponding the vertexes to the PEs, and data routing, to generate the required deployment of the hardware configuration of the CGRA at every time step.

In the prior art, the vertexes and the edges in the DDG are mapped to the hardware architecture of the CGRA, and the generated hardware configuration has a poor operation performance, for example a large initial interval (II) and a low utilization rate of the PEs.

SUMMARY

An object of the present disclosure is to provide a mapping method and a mapping device for a reconfigurable array.

In order to achieve the above-mentioned object, the technical solutions are as follows.

In a first aspect of the present disclosure, a mapping method for a reconfigurable array is provided. The mapping method includes: S1: obtaining a data dependence graph, and analyzing the data dependence graph to obtain a maximum time step TS_max and a minimum initial interval; S2: using the minimum initial interval as a start value of an initial interval; S3: obtaining a reconfigurable architecture, wherein the reconfigurable architecture includes a processing element and a link, the link includes an output link and an input link, a relationship between the processing element and the output link is indicated by a first adjacency matrix, and a relationship between the input link and the processing element is indicated by a second adjacency matrix; S4: copying the first adjacency matrix and the second adjacency matrix to form a mapping space with a same number of layers as a value of the TS_max; S5: setting a constraint condition to establish an integer linear programming model, and mapping, with the integer linear programming model, a processing vertex, an intra-cycle edge that is a dependency within a cycle, and an inter-cycle edge that is a dependence across different cycles of a circular structure in the data dependence graph, to the mapping space, respectively, wherein, in the integer linear programming model, the intra-cycle edge modulo the TS_max is performed, and the inter-cycle edge modulo the initial interval is performed; S6: determining whether the mapping between the data dependence graph which represents the cycle(s), and the reconfigurable architecture has a solution in the integer linear programming model, performing S8 if yes, and performing S7 if no; S7: adding 1 to the initial interval, and performing S5; S8: obtaining a mapping relationship from the processing vertex and the edge in the data dependence graph to the processing element and the link of extended TS_max layers; and S9: generating configuration information by the mapping relationship modulo the initial interval, generating, according to the configuration information, a configuration file that is input to the reconfigurable architecture, and performing an operation by the reconfigurable architecture according to the configuration file.

In a second aspect of embodiments of the present disclosure, a mapping device for a reconfigurable array is provided. The mapping device includes a processor, and a memory having stored therein a computer program that, when executed by the processor, causes the processor to perform the method as described in the first aspect.

In a third aspect of embodiments of the present disclosure, a non-transitory computer-readable storage medium having stored therein instructions that, when executed by a processor, are configured to perform the method the method as described in the first aspect.

DETAILED DESCRIPTION

Figure 1:
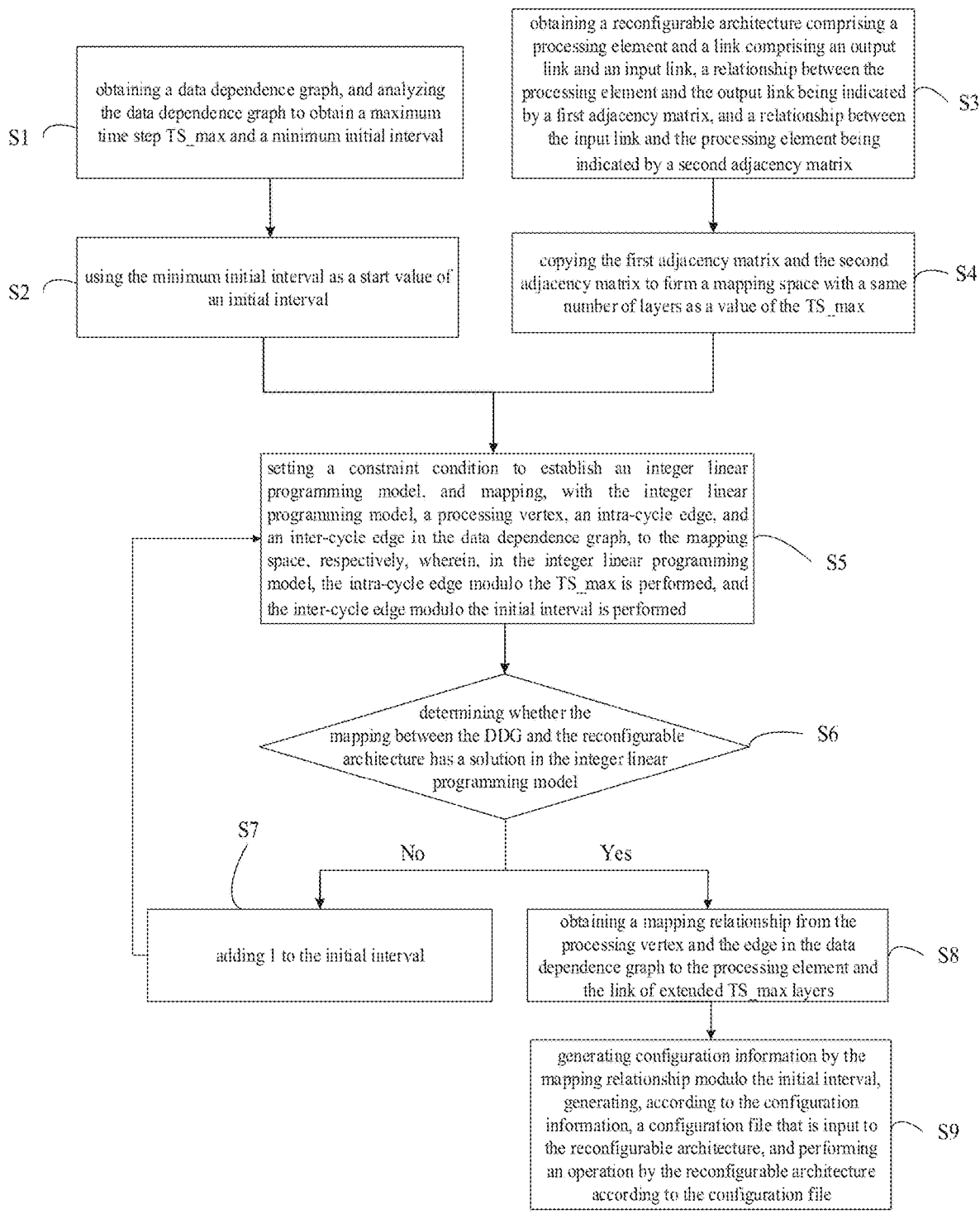
FIG. 1 is a flow chart of a mapping method for a reconfigurable array according to an embodiment of the present disclosure.

Embodiments of the present disclosure are described in detail below, examples of which are illustrated in the drawings. The same or similar elements are denoted by same reference numerals in different drawings unless indicated otherwise. The embodiments described herein with reference to drawings are explanatory, and used to generally understand the present disclosure. The embodiments shall not be construed to limit the present disclosure.

An object of the present disclosure is to provide a mapping method, a mapping apparatus and a mapping device for a reconfigurable array, which are capable of mapping a data dependence graph on a hardware architecture of a CGRA in time and space domains, and achieving a fast mapping speed and a small initial interval and a high level PE utilization of the CGRA.

The present disclosure provides in embodiments a mapping method, including: S1: obtaining a data dependence graph, and analyzing the data dependence graph to obtain a maximum time step TS_max and a minimum initial interval; S2: using the minimum initial interval as a start value of an initial interval; S3: obtaining a reconfigurable architecture, wherein the reconfigurable architecture includes a processing element and a link, the link includes an output link and an input link, a relationship between the processing element and the output link is indicated by a first adjacency matrix, and a relationship between the input link and the processing element is indicated by a second adjacency matrix; S4: copying the first adjacency matrix and the second adjacency matrix to form a mapping space with a same number of layers as a value of the TS_max; S5: setting a constraint condition to establish an integer linear programming model, and mapping, with the integer linear programming model, a processing vertex, an intra-cycle edge that is a dependency within a cycle, and an inter-cycle edge that is a dependence across different cycles of a circular structure in the data dependence graph, to the mapping space, respectively, wherein, in the integer linear programming model, the intra-cycle edge modulo the TS_max is performed, and the inter-cycle edge modulo the initial interval is performed; S6: determining whether the mapping between the data dependence graph which represents the cycle(s), and the reconfigurable architecture has a solution in the integer linear programming model, performing S8 if yes, and performing S7 if no; S7: adding 1 to the initial interval, and performing S5; S8: obtaining a mapping relationship from the processing vertex and the edge in the data dependence graph to the processing element and the link of extended TS_max layers; and S9: generating configuration information by the mapping relationship modulo the initial interval, generating, according to the configuration information, a configuration file that is input to the reconfigurable architecture, and performing an operation by the reconfigurable architecture according to the configuration file.

Compared with the prior art, the present disclosure achieves the following technical effects.

The relation between the processing element and the output link of the reconfigurable architecture is indicated by the first adjacency matrix, and the relation between the input link and the processing element of the reconfigurable architecture is indicated by the second adjacency matrix. The mapping space includes multiple layers, which is generated by copying the first adjacency matrix and the second adjacency matrix, and the number of the layers is the same as the value of the TS_max. The constraint condition is set to establish the integer linear programming model. Under this model, the intra-cycle edge that is a dependence within a cycle, and the inter-cycle edge that is a dependence across different cycles of the circular structure are mapped to the mapping space, respectively. The intra-cycle edge modulo the TS_max is performed, and the inter-cycle edge modulo the initial interval is performed. It is determined whether the mapping between the data dependence graph and the reconfigurable architecture has a solution in the integer linear programming model. If yes, an optimal solution is output as the configuration information. If no, the initial interval II is increased by one, and the solving process is performed again. These operations are repeated until one solution is obtained. In this way, the data dependence graph is mapped on the hardware architecture of the CGRA in time and space domains, and achieving a fast mapping speed, and a high level resource utilization and a small initial interval of the CGRA.

In some embodiments of the present disclosure, the S5 includes: S51: setting a first group of binary mapping variables and a second group of binary mapping variables, where the first group of binary mapping variables are mapping variables from the processing vertexes in the data dependence graph to the processing elements of the reconfigurable architecture, and the second group of binary mapping variables are mapping variables from the edges in the data dependence graph to the links, which are between and connecting the processing elements, of the reconfigurable architecture; S52: setting an objective function to minimize the number of the links used for the mapping; S53: setting each processing vertex in the data dependence graph to be mapped to one processing element, setting one processing element of one layer configuration to map at most one processing vertex; S54: setting one processing vertex in the data dependence graph to be only mapped to the processing element that performs the operation; S55: setting each edge in the data dependence graph to be mapped to at least one link; S56: setting one link of one layer configuration to map at most one edge; S57: setting a first connectivity constraint for the intra-cycle edge, wherein the first connectivity constraint is such that when an $i^{th}$ processing vertex is mapped to a $j^{th}$ processing element, an edge connected from the $i^{th}$ processing vertex is mapped to a link connected from the $j^{th}$ processing element; S58: setting a second connectivity constraint for the intra-cycle edge, wherein the second connectivity constraint ensures that when the $i^{th}$ processing vertex is mapped to the $j^{th}$ processing element, an edge connected to the $i^{th}$ processing vertex is mapped to a link connected to the $j^{th}$ processing element; S59: setting a third connectivity constraint for the inter-cycle edge, wherein the third connectivity constraint is such that when the $i^{th}$ processing vertex is mapped to the $j^{th}$ processing element, the edge connected from the $i^{th}$ processing vertex is mapped to the link connected from the $j^{th}$ processing element, and a target solution of the third connectivity constraint is an edge indicating a dependency across different cycles in the data dependence graph and a modulo of the initial interval; S510: setting a fourth connectivity constraint for the inter-cycle edge, wherein the fourth connectivity constraint ensures that when the $i^{th}$ processing vertex is mapped to the $j^{th}$ processing element, an edge connected to the $i^{th}$ processing vertex is mapped to a link connected to the $j^{th}$ processing element, and a target solution of the fourth connectivity constraint is an edge indicating a dependency across different cycles in the data dependence graph and a modulo of the initial interval; S511: setting a first continuity constraint for the intra-cycle edge, wherein when the first continuity constraint is for the $i^{th}$ processing element, if the $i^{th}$ processing vertex has one $a^{th}$ input edge and the $a^{th}$ input edge is mapped to one input link of the $j^{th}$ processing element, the $i^{th}$ processing vertex is mapped to the $j^{th}$ processing element, or the $a^{th}$ input edge is simultaneously mapped to one output link of the $j^{th}$ processing element; S512: setting a second continuity constraint for the intra-cycle edge, wherein when the second continuity constraint is for the $j^{th}$ processing element, if the $i^{th}$ processing vertex has one $a^{th}$ output edge and the $a^{th}$ output edge is mapped to one output link of the $j^{th}$ processing element, the $i^{th}$ processing vertex is mapped to the $j^{th}$ processing element, or the $a^{th}$ output edge is simultaneously mapped to one input link of the $j^{th}$ processing element; S513: setting a third continuity constraint for the inter-cycle edge, wherein when the third continuity constraint is for the $j^{th}$ processing element, if the $i^{th}$ processing vertex has one $a^{th}$ input edge and the $a^{th}$ input edge is mapped to one input link of the $j^{th}$ processing element, the $i^{th}$ processing vertex is mapped to the $j^{th}$ processing element, or the $a^{th}$ input edge is simultaneously mapped to one output link of the $j^{th}$ processing element, and a target solution of the third continuity constraint is an edge indicating a dependency across different cycles in the data dependence graph and a modulo of the initial interval; S514: setting a fourth continuity constraint for the inter-cycle edge, wherein when the fourth continuity constraint is for the $j^{th}$ processing element, if the $i^{th}$ processing vertex has one $a^{th}$ output edge and the $a^{th}$ output edge is mapped to one output link of the $j^{th}$ processing element, the $i^{th}$ processing vertex is mapped to the $j^{th}$ processing element, or the $a^{th}$ output edge is simultaneously mapped to one input link of the $j^{th}$ processing element, and a target solution of the fourth continuity constraint is an edge indicating a dependency across different cycles in the data dependence graph and a modulo of the initial interval; S515: setting that if one edge in the data dependency graph is simultaneously mapped to one input link and one output link of one processing element, the processing element cannot map the processing vertex in the data dependence graph; and S516: setting one processing element of one layer configuration to map only one route.

In some embodiments of the present disclosure, the first group of binary mapping variables in S51 is set by a formula (1):

$$V2M(V,M), V=\text{the number of vertexes}, \quad M=PE\_num*TS\_max \tag{1}$$

where V2M( ) represents a group of binary variables of a mapping relationship between processing vertexes in the data dependence graph and processing elements of the reconfigurable architecture, V represents the number of the processing vertexes in the data dependence graph, M represents the number of processing elements of the mapping space after extension with the maximum time step TS_max, and PE_num represents the number of the processing elements of the reconfigurable architecture;

wherein the second group of binary mapping variables in S51 is set by a formula (2):

$$E2L(E,L), E=\text{the number of edges}, \quad L=\text{link\_num}*TS\_max \tag{2}$$

where E2L( ) represents a group of binary variables of a mapping relationship between edges in the data dependence graph and links of the reconfigurable architecture, E represents the number of the edges in the data dependence graph, L represents the number of links of the mapping space after expansion with the maximum time step TS_max, and L_num represents the number of the links of the reconfigurable architecture;

wherein the setting in S52 is performed by a formula (3):

$$\text{obj}=\text{Minimize}(\Sigma_{j \in L, i \in E} E2L(i,j)) \tag{3}$$

where obj represents the objective function; and wherein S53 is performed by a formula (4) and a formula (5):

$$\sum_{j \in M} V2M(i, j) = 1, \forall i \in V \tag{4}$$

$$\sum_{i \in V} V2M(i, ii*PE\_num + j) \le 1, \forall j \in PE\_num, \forall ii \in II. \tag{5}$$

In some embodiments of the present disclosure, S54 is performed by a formula (6):

$$\sum_{j \in M} support_{op(j)} * V2M(i, j) = 1, \forall i \in V \tag{6}$$

where $support_{op(j)}$ represents a group of constraint matrices, indicating different types of the processing elements, wherein in a constraint matrix indicating one type of the processing elements, the processing elements of this type are represented by a corresponding value of 1, and other processing elements are represented by 0;

wherein S55 is performed by a formula (7):

$$\sum_{b \in L} E2L(a, b) \ge 1, \forall a \in E; \tag{7}$$

and wherein S56 is performed by a formula (8):

$$\sum_{a \in E} E2L(a, ii*L\_num + b) \le 1, \forall b \in L\_num, \forall ii \in II \tag{8}$$

where L_num represents the number of the links of the reconfigurable architecture.

In some embodiments of the present disclosure, S57 is performed by a formula (9):

$$V2M(i, TS*PE\_num + j) \le \sum_{b \in L\_num} E2L(a, (TS+1) \% TS\_max * L\_num + b) \tag{9}$$

where $n2l[j][b]$ &$G[i][a+V]$ & intra_dep_edge[a]

$\forall a \in E, \forall TS \in TS\_max, \forall j \in PE\_num, \forall i \in V$ where intra_dep_edge[ ] represents an edge that is a dependence within a cycle in the data dependence graph;

wherein S58 is performed by a formula (10):

$$V2M(i, TS*PE\_num + j) \le \sum_{b \in L\_num} E2L(a, TS*L\_num + b) \tag{10}$$

where $l2n[j][b]$ &$G[a+V][i]$ & intra_dep_edge[a]

$\forall a \in E, \forall TS \in TS\_max, \forall j \in PE\_num, \forall i \in V$ where TS represents a time step at which the processing vertex in the data dependence graph is executed, and intra_dep_edge[ ] represents an edge that is a dependence within a cycle in the data dependence graph;

wherein S59 is performed by a formula (11):

$$V2M(i, ii*\text{PE\_num}+j) \leq \sum_{b \in \text{L\_num, if } n2l[j][b]} E2L(a, (ii+1)\% II*\text{L\_num}+b) \quad (11)$$

where $n2l[j][b]$ & $G[i][a+V]$ & $\text{inner\_dep\_edge}[a]$ $\forall a \in E, \forall j \in \text{PE\_num}, \forall ii \in II, \forall i \in V$ where n2l[ ][ ] represents the first adjacency matrix for indicating a connection relationship between the processing element and the output link of the reconfigurable architecture, G[ ][ ] represents an adjacency matrix for indicating a connection relationship between the processing vertex and the edge in the data dependence graph, and inner_dep_edge[ ] represents an edge that is a dependence across different cycles in the data dependence graph;

wherein S510 is performed by a formula (12):

$$V2M(i, ii*\text{PE\_num}+j) \leq \sum_{b \in \text{L\_num, if } l2n[j][b]} E2L(a, (ii*\text{L\_num}+b) \quad (12)$$

where $l2n[j][b]$ & $G[a+V]$ & $\text{inner\_dep\_edge}[a]$ $\forall a \in E, \forall j \in \text{PE\_num}, \forall ii \in II, \forall i \in V$ where l2n[ ][ ] represents the second adjacency matrix for indicating a connection relationship between the input link and the processing element of the reconfigurable architecture;

wherein S511 is performed by a formula (13):

$$\sum_{b \in \text{L\_num, if } l2n[j][b]} E2L(a, TS*L_{num}+b) \leq V2M(i, TS*PE_{num}+j) + \sum_{c \in \text{L\_num, if } n2l[j][c]} E2L(a, (TS+1)\% TS\_max*\text{L\_num}+c) \quad (13)$$

where $\text{intra\_dep\_edge}[a]$ & $\text{graph}[a+V][i]$ $\forall a \in E, j \in \text{PE\_num}, TS \in \text{TS\_max}, i \in V$ where intra_dep_edge[ ] represents an edge that is a dependence within a cycle in the data dependence graph;

wherein S512 is performed by a formula (14):

$$\sum_{b \in \text{L\_num, if } n2l[j][b]} E2L(a, (TS+1)\% \text{TS\_max}*\text{L\_num}+b) \leq V2M(i, TS*PE_{num}+j) + \sum_{c \in \text{L\_num, if } l2n[j][c]} E2L(a, TS*\text{L\_num}+c) \quad (14)$$

where $\text{intra\_dep\_edge}[a]$ & $\text{graph}[a+V]$ $\forall a \in E, j \in \text{PE\_num}, TS \in \text{TS\_max}, i \in V;$ wherein S513 is performed by a formula (15):

$$\sum_{b \in \text{L\_num, if } l2n[j][b]} E2L(a, ii*L_{num}+b) \leq V2M(i, ii*PE_{num}+j) + \sum_{c \in \text{L\_num, if } n2l[j][c]} E2L(a, (ii+1)\% II*\text{L\_num}+c) \quad (15)$$

where $\text{inner\_dep\_edge}[a]$ & $\text{graph}[a+V][i]$ $\forall a \in E, j \in \text{PE\_num}, ii \in II, i \in V;$ and
wherein S514 is performed by a formula (16):

$$\sum_{b \in \text{L\_num, if } n2l[j][b]} E2L(a, (ii+1)\% II*L_{num}+b) \leq V2M(i, ii*PE_{num}+j) + \sum_{c \in \text{L\_num, if } l2n[j][c]} E2L(a, (ii*\text{L\_num}+c) \quad (16)$$

where $\text{inner\_dep\_edge}[a]$ & $\text{graph}[i][a+V]$ $\forall a \in E, j \in \text{PE\_num}, ii \in II, i \in V.$ In some embodiments of the present disclosure, S515 is performed by a formula (17):

$$\sum_{b \in \text{L\_num, if } l2n[j][b]} E2L(a, ii*L_{num}+b) + V2M(i, ii*\text{PE\_num}+j) \leq 1 \quad (17)$$

where $\text{graph}[a+V][i] == 0$ $\forall a \in E, \forall ii \in II, \forall j \in \text{PE\_num}, \forall i \in V;$ and
wherein S516 is performed by a formula (18):

$$\sum_{b \in \text{L\_num, if } l2n[j][b]} E2L(a, ii*\text{L\_num}+b) + \sum_{b \in \text{L\_num, if } l2n[j][b]} E2L(c, ii*\text{L\_num}+b) \leq 1 \quad (18)$$

where $\text{dst\_list}[a] \neq \text{dst\_list}[c]$ $\forall j \in \text{PE\_num}, \forall ii \in II, \forall c \in E, \forall a \in E$ where dst_list[ ] represents a serial number of a processing vertex corresponding to each edge in the data dependence graph.

The present disclosure will be described in the embodiments below with reference to the accompanying drawings.

As shown in FIG. 1, a mapping method for a reconfigurable array according to an embodiment of the present disclosure includes the following steps.

In S1, a data dependence graph is obtained, and the data dependence graph is analyzed to obtain a maximum time step TS_max and a minimum initial interval.

A high-level language program, for example, a high-level language program edited using a computer programming language C++, is input by a user and needs to be compiled by a compiler and burned into the reconfigurable architecture. The high-level language program may be used in artificial intelligence applications such as speech recognition and image recognition.

A circular structure in the high-level language program is a circular statement, which is marked. The compiler extracts the marked circular structure in the high-level language program and generates a data dependence graph (DDG). The DDG represents a form of data flow and is composed of vertexes and edges which are between the vertexes and indicate data dependency relationships. The vertex and the edge in the DDG should be mapped to the hardware architecture of the CGRA.

Figure 2:
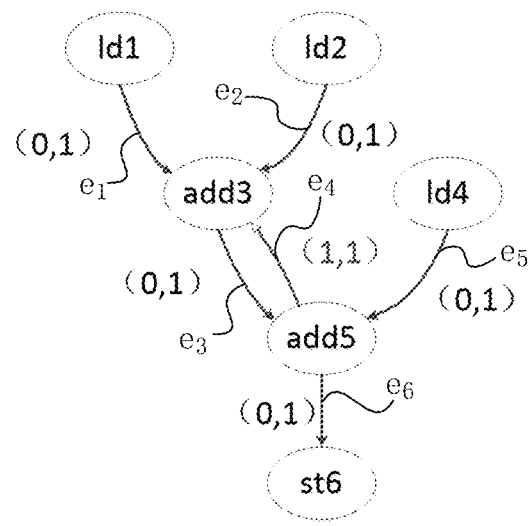
FIG. 2 is a data dependence graph according to an embodiment of the present disclosure.

FIG. 2 shows a data dependence graph according to an embodiment of the present disclosure.

As shown in FIG. 2, the DDG has six edges e1 to e6. An edge with a solid arrow represents a dependency within a cycle, and an edge with an empty arrow represents a dependency across different cycles. These two types of edges are marked by data structures in the DDG. The data structures may be normal structures known for a practical DDG. A connection which a direction between two vertexes represents the dependency relationship between data of the vertexes.

An adjacency matrix G(V+E,V+E) is used to represent the connection relationship between the vertex and the edge of the DDG. The input DDG is analyzed to obtain the maximum time step TS_max and the minimum initial interval MII for the DDG.

For the data dependence graph shown in FIG. 2, the TS_max is 4 and the II is 2 which are calculated from the following formulas:

$$II_{res} = \frac{\text{the number of vertexes}}{\text{the number of } PEs} = \left\lceil \frac{6}{9} \right\rceil = 1$$

$$II_{dep} = \left\lceil \frac{\min \theta}{dif\, \theta} \right\rceil = \frac{1+1}{1} = 2$$

$$II = \max(II_{res}, II_{dep}) = 2$$

where min represents a dependent delay corresponding to an edge, dif represents the number of cyclic intervals of an edge, minθ represents a min sum of edges that form a cycle in the DDG, difθ represents a dif sum of edges that form a cycle in the DDG, $II_{res}$ represents a resource constraint, and $II_{dep}$ represents a circular dependency constraint.

In S2, the minimum initial interval is used as a start value of an initial interval.

The initial interval refers to an initial interval (II) between two cycles, which can also be understood as the number of configurations. In this step, the minimum initial interval MII obtained in S1 is assigned to the start value of the initial interval II.

In S3, a reconfigurable architecture is obtained. The reconfigurable architecture includes a processing element and a link including an output link and an input link, a relationship between the processing element and the output link is indicated by a first adjacency matrix, and a relationship between the input link and the processing element is indicated by a second adjacency matrix.

For example, the first adjacency matrix n21 (PE_num, L_num) is used to represent the relationship between the PE and the output link of the CGRA, and the second adjacency matrix 12n (PE_num, L_num) is used to represent the relationship between the input link and the PE, where PE_num represents the number of PEs of the CGRA, and L_num represents the number of links of the CGRA.

Figure 3:
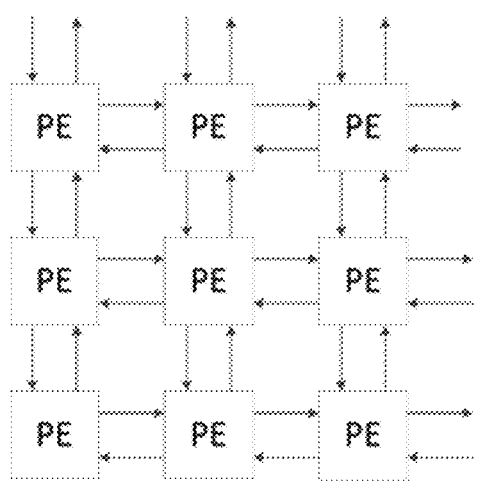
FIG. 3 is a schematic diagram of a reconfigurable array according to an embodiment of the present disclosure.

An architecture shown in FIG. 3 may be used to show the hardware architecture of the reconfigurable architecture, where PE represents the processing elements, an arrow with a direction between two adjacent PEs represents an interconnection relationship between the PEs. FIG. 3 schematically shows nine PEs.

In S4, the first adjacency matrix and the second adjacency matrix are copied to form a mapping space with a same number of layers as a value of the TS_max.

For example, the TS_max is 10, and the first adjacency matrix and the second adjacency matrix are copied into 10 layers to be used as the mapping space. Each layer has one first adjacency matrix and one second adjacency matrix. In this way, an accuracy of a timing sequence of the vertexes during the mapping may be ensured.

In S5, a constraint condition is set to establish an integer linear programming model, and with the integer linear programming model, a processing vertex, an intra-cycle edge that is a dependence within a cycle, and an inter-cycle edge that is a dependence across different cycles of a circular structure in the data dependence graph are mapped to the mapping space, respectively. In the integer linear programming model, the intra-cycle edge modulo the TS_max is performed, and the inter-cycle edge modulo the initial interval is performed.

In order to ensure that the intra-cycle edge and the inter-cycle edge can be mapped correctly in the timing sequence, in the integer linear programming model, the intra-cycle edge and the inter-cycle edge are mapped separately. In the integer linear programming model, the intra-cycle edge modulates the TS_max, and the inter-cycle edge modulates the II.

In S6, it is determined whether the mapping between the data dependence graph which represents the cycle(s), and the reconfigurable architecture has a solution in the integer linear programming model. If yes, S8 is performed and if no, S7 is performed.

In S7, the initial interval is increased by one, and S5 is performed.

It is determined whether the mapping between the data dependence graph and the reconfigurable architecture has a solution in the integer linear programming model. If no, the initial interval II is increased by one, and the solving process is performed again. These operations are repeated until one solution is obtained. The obtained solution is an optimal solution.

In S8, a mapping relationship from the processing vertex and the edge in the data dependence graph to the processing element and the link of extended TS_max layers is obtained.

Figure 4:
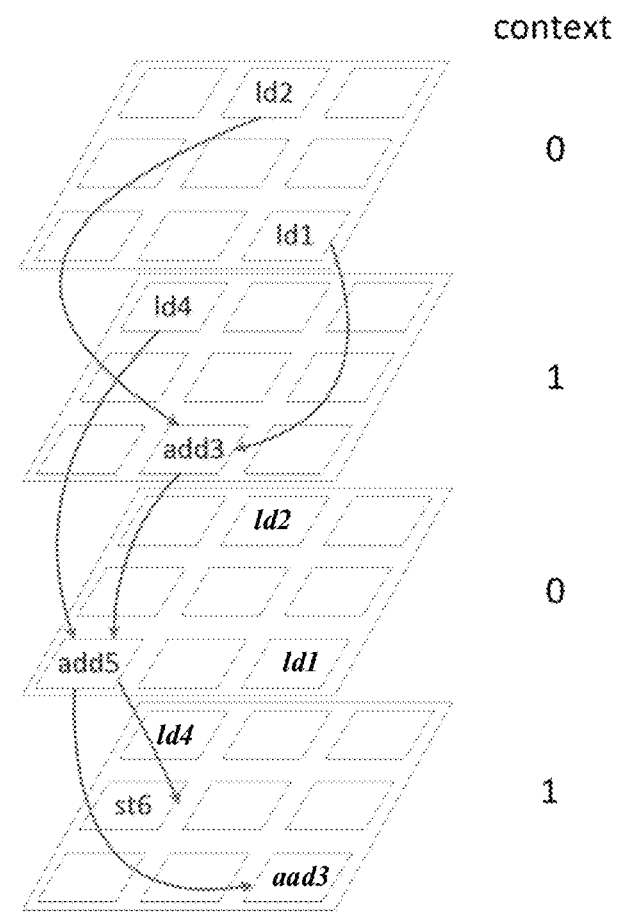
FIG. 4 is a schematic diagram showing a result of mapping a data dependence graph to a CGRA according to an embodiment of the present disclosure.

FIG. 4 is a schematic diagram showing a result of mapping the data dependence graph as shown in FIG. 2 to the CGRA as shown in FIG. 3.

Each layer in FIG. 4 represents a status of the CGRA, i.e., an array of PEs at a different time. In FIG. 4, the CGRA array includes 9 small squares, and each small square represents one PE, that is, the CGRA array includes 9 PEs. In this way, different processing vertexes may be mapped to different PEs.

Processing vertexes ld1 and ld2 are mapped on the PEs as shown. Different fonts of the same reference numeral refer to the same type of the processing vertex in different cycles. For example, ld1 and italic ld1 represent the same type of the processing vertex in different cycles.

Serial numbers 0 and 1 below context at right refer to serial numbers of two layer configurations, and the layers 0 and 1 shows information of the two layer configurations which has been last output. The configuration information shows that one vertex is mapped to which PE at which time. For example, mapping relationships between the vertex and the PE corresponding to the layers having a context marked as 0 are the same, that is, they represents one configuration.

The problem of mapping the DDG to the CGRA is solved, and the mapping relationship between the vertex and the edge in the DDG to the PE and the link of the extended TS_max layers is obtained. In the following S9, the mapping result of the vertex and the edge modulates an initial interval II, and a final configuration information is obtained.

In S9, configuration information is generated by the mapping relationship modulo an initial interval, a configuration file that is input to the reconfigurable architecture is generated according to the configuration information, and an operation is performed by the reconfigurable architecture according to the configuration file.

In the present disclosure, the mapping space includes multiple layers, which are generated by copying the first adjacency matrix and the second adjacency matrix of the reconfigurable array, and the number of the layers is the same as the value of the TS_max. The constraint condition is set to establish the integer linear programming model. Under this model, the processing vertex, the intra-cycle edge, and the inter-cycle edge of the circular structure are mapped to the mapping space, respectively. The intra-cycle edge modulo the TS_max is performed, and the inter-cycle edge modulo the initial interval is performed.

It is determined whether the mapping between the data dependence graph and the reconfigurable architecture has a solution in the integer linear programming model. If yes, an optimal solution is output as the configuration information. If no, the initial interval II is increased by one, and the solving process is performed again. These operations are repeated until one solution is obtained.

The mapping relationship from the processing vertex and the edge in the data dependence graph to the processing element and the link of the extended TS_max layers is obtained. The configuration information is generated by the mapping relationship modulo the initial interval. The configuration file that is input to the reconfigurable architecture is generated according to the configuration information, and the operation is performed by the reconfigurable architecture according to the configuration file. In this way, the data dependence graph is mapped on the hardware architecture of the CGRA in time and space domains.

Since the above-mentioned problem which is solved by using the integer linear programming is essentially an optimization problem, the solution obtained is the optimal solution.

In a mapping test based on the present disclosure, the utilization rate of the PEs of the CGRA may be up to 100%.

The solving speed of the present disclosure may be affected by a linear programming solver used, but for the most of the test cases, the optimal solution can be obtained in 30s. Compared with the prior art, the mapping speed is greatly improved.

The present disclosure is capable of achieving a fast mapping speed, and a high resource utilization rate and a small initial interval of the CGRA.

In an embodiment, S5 of the present application includes the following S51 to S516.

In S51, a first group of binary mapping variables and a second group of binary mapping variables are set. The first group of binary mapping variables are mapping variables from the processing vertexes in the data dependence graph to the processing elements of the reconfigurable architecture. The second group of binary mapping variables are mapping variables from the edges in the data dependence graph to the links, which are between and connecting the processing elements, of the reconfigurable architecture.

In S52, an objective function is set to minimize the number of the links used for the mapping.

Since the mapping of the route is an implicit mapping, the number of the links used by the mapping is minimized, that is, the routing resource used by the mapping is minimized.

In S53, each processing vertex in the data dependence graph is set to be mapped to one processing element, and one processing element of one layer configuration is set to map at most one processing vertex.

In S54, one processing vertex in the data dependence graph is set to be only mapped to the processing element that performs the operation.

In other words, one vertex in the DDG is only mapped to the PE which performs the corresponding operation/calculation, to ensure a validity of the mapping of the PE.

In S55, each edge in the data dependence graph is set to be mapped to at least one link.

In this way, it may be guaranteed that every edge in the DDG is at least mapped to one link.

In S56, one link of one layer configuration is set to map at most one edge.

In S57, a first connectivity constraint is set for the intra-cycle edge. The first connectivity constraint is such that when an $i^{th}$ processing vertex is mapped to a $j^{th}$ processing element, an edge connected from the $i^{th}$ processing vertex is mapped to a link connected from the $j^{th}$ processing element.

In S58, a second connectivity constraint is set for the intra-cycle edge. The second connectivity constraint ensures that when the $i^{th}$ processing vertex is mapped to the $j^{th}$ processing element, an edge connected to the $i^{th}$ processing vertex is mapped to a link connected to the $j^{th}$ processing element.

In S59, a third connectivity constraint is set for the inter-cycle edge, which is similar to the first connectivity constraint. That is, the third connectivity constraint is such that when the $i^{th}$ processing vertex is mapped to the $j^{th}$ processing element, the edge connected from the $i^{th}$ processing vertex is mapped to the link connected from the $j^{th}$ processing element.

A difference between the third connectivity constraint and the first connectivity constraint is that a target solution of the third connectivity constraint is an edge indicating a dependency across different cycles in the data dependence graph and a modulo of the initial interval.

In S510, a fourth connectivity constraint is set for the inter-cycle edge, which is similar to the second connectivity constraint. That is, the fourth connectivity constraint ensures that when the $i^{th}$ processing vertex is mapped to the $j^{th}$ processing element, an edge connected to the $i^{th}$ processing vertex is mapped to a link connected to the $j^{th}$ processing element.

A difference between the fourth connectivity constraint and the second connectivity constraint is that a target solution of the fourth connectivity constraint is an edge indicating a dependency across different cycles in the data dependence graph and a modulo of the initial interval.

In S511, a first continuity constraint is set for the intra-cycle edge. When the first continuity constraint is for the $j^{th}$ processing element, if the $i^{th}$ processing vertex has one $a^{th}$ input edge and the $a^{th}$ input edge is mapped to one input link of the $j^{th}$ processing element, the $i^{th}$ processing vertex is mapped to the $j^{th}$ processing element, or the $a^{th}$ input edge is simultaneously mapped to one output link of the $j^{th}$ processing element.

In S512, a second continuity constraint is set for the intra-cycle edge. When the second continuity constraint is for the $j^{th}$ processing element, if the $i^{th}$ processing vertex has one $a^{th}$ output edge and the $a^{th}$ output edge is mapped to one output link of the $j^{th}$ processing element, the $i^{th}$ processing vertex is mapped to the $j^{th}$ processing element, or the $a^{th}$ output edge is simultaneously mapped to one input link of the $j^{th}$ processing element.

In S513, a third continuity constraint is set for the inter-cycle edge, which is similar to the first continuity constraint. That is, when the third continuity constraint is for the $j^{th}$ processing element, if the $i^{th}$ processing vertex has one $a^{th}$ input edge and the $a^{th}$ input edge is mapped to one input link of the $j^{th}$ processing element, the $i^{th}$ processing vertex is mapped to the $j^{th}$ processing element, or the $a^{th}$ input edge is simultaneously mapped to one output link of the $j^{th}$ processing element.

A difference between the third continuity constraint and the first continuity constraint is that a target solution of the third continuity constraint is an edge indicating a dependency across different cycles in the data dependence graph and a modulo of the initial interval;

In S514, a fourth continuity constraint is set for the inter-cycle edge, which is similar to the second continuity constraint. That is, when the fourth continuity constraint is for the $j^{th}$ processing element, if the $i^{th}$ processing vertex has one $a^{th}$ output edge and the $a^{th}$ output edge is mapped to one output link of the $j^{th}$ processing element, the $i^{th}$ processing vertex is mapped to the $j^{th}$ processing element, or the $a^{th}$ output edge is simultaneously mapped to one input link of the $j^{th}$ processing element.

A difference between the fourth continuity constraint and the second continuity constraint is that a target solution of the fourth continuity constraint is an edge indicating a dependency across different cycles in the data dependence graph and a modulo of the initial interval.

In S515, it is set that if one edge in the data dependency graph is simultaneously mapped to one input link and one output link of one processing element, the processing element cannot map the processing vertex in the data dependence graph.

In S516, one processing element of one layer configuration is set to map only one route.

The specific constraint conditions of the present disclosure are described as above, and are used to establish the integer linear programming model.

The scheduling and mapping of the DDG of the present disclosure are solved under the established integer linear programming model. In an embodiment, when the data transfer between two vertexes cannot be completed in adjacent time steps, a routing vertex may be inserted between the two vertexes to ensure the timing accuracy. In this embodiment, the insertion of the routing vertex is implicit. That is, for one PE, if an edge in the DDG is mapped to the input and output links of the PE at the same time, the PE is served as a routing vertex.

In the present disclosure, operator scheduling and mapping are integrated, and both are obtained by solving the integer linear programming model, which greatly improves the flexibility and efficiency of the mapping.

In some embodiments, the constraint conditions are set by the following formulas to establish the integer linear programming model.

The first group of binary mapping variables in S51 is set by a formula (1):

$$V2M(V,M), V=\text{the number of vertexes}, \quad M=PE\_num*TS\_max \quad (1)$$

where $V2M(\ )$ represents a group of binary variables of a mapping relationship between processing vertexes in the data dependence graph and processing elements of the reconfigurable architecture, V represents the number of the processing vertexes in the data dependence graph, M represents the number of processing elements of the mapping space after extension with the maximum time step TS_max, and PE_num represents the number of the processing elements of the reconfigurable architecture.

The second group of binary mapping variables in S51 is set by a formula (2):

$$E2L(E,L), E=\text{the number of edges}, \quad L=\text{link\_num}*TS\_max \quad (2)$$

where $E2L(\ )$ represents a group of binary variables of a mapping relationship between edges in the data dependence graph and links of the reconfigurable architecture, E represents the number of the edges in the data dependence graph, L represents the number of links of the mapping space after expansion with the maximum time step TS_max, and L_num represents the number of the links of the reconfigurable architecture.

The setting in S52 is performed by a formula (3):

$$\text{obj}=\text{Minimize}(\Sigma_{i\in L, i\in E} E2L(i,j)) \quad (3)$$

where obj represents the objective function.

S53 is performed by a formula (4) and a formula (5):

$$\sum_{j\in M} V2M(i,j) = 1, \forall i \in V \quad (4)$$

$$\sum_{i\in V} V2M(i, ii*PE\_num + j) \leq 1, \forall j \in PE\_num, \forall ii \in II. \quad (5)$$

S54 is performed by a formula (6):

$$\sum_{j\in M} \text{support}_{op(j)} * V2M(i,j) = 1, \forall i \in V \quad (6)$$

where $\text{support}_{op(j)}$ represents a group of constraint matrices, indicating different types of the processing elements, wherein in a constraint matrix indicating one type of the processing elements, the processing elements of this type are represented by a corresponding value of 1, and other processing elements are represented by 0.

S55 is performed by a formula (7):

$$\sum_{b\in L} E2L(a,b) \geq 1, \forall a \in E. \quad (7)$$

S56 is performed by a formula (8):

$$\sum_{a\in E} E2L(a, ii*L\_num + b) \leq 1, \forall b \in L\_num, \forall ii \in II \quad (8)$$

where L_num represents the number of the links of the reconfigurable architecture.

S57 is performed by a formula (9):

$$V2M(i, TS*\text{PE\_num}+j) \leq \sum_{b\in \text{L\_num}} E2L(a, (TS+1)\%\text{TS\_max}*\text{L\_num}+b) \quad (9)$$

where $n2l[j][b]$ &$G[i][a+V]$ &intra_dep_edge$[a]$ $\forall a \in E, \forall TS \in \text{TS\_max}, \forall j \in \text{PE\_num}, \forall i \in V$ where intra_dep_edge[ ] represents an edge that is a dependence within a cycle in the data dependence graph.

S58 is performed by a formula (10):

$$V2M(i, TS*\text{PE\_num}+j) \leq \sum_{b\in \text{L\_num}} E2L(a, TS*\text{L\_num}+b) \quad (10)$$

where $l2n[j][b]$ &$G[a+V][i]$ & intra_dep_edge$[a]$ $\forall a \in E, \forall TS \in \text{TS\_max}, \forall j \in \text{PE\_num}, \forall i \in V$ where TS represents a time step at which the processing vertex in the data dependence graph is executed, and intra_dep_edge[ ] represents an edge that is a dependence within a cycle in the data dependence graph.

S59 is performed by a formula (11):

$$V2M(i, ii*\text{PE\_num}+j) \leq \sum_{b\in \text{L\_num,if } n2l[j][b]} E2L(a, (ii+1)\% II*\text{L\_num}+b) \quad (11)$$

where $n2l[j][b]$ &$G[a+V][i]$ & inner_dep_edge$[a]$ $\forall a \in E, \forall j \in \text{PE\_num}, \forall ii \in II, \forall i \in V$ where n2l[ ][ ] represents the first adjacency matrix for indicating a connection relationship between the processing element and the output link of the reconfigurable architecture, G[ ][ ] represents an adjacency matrix for indicating a connection relationship between the processing vertex and the edge in the data dependence graph, and inner_dep_edge[ ] represents an edge that is a dependence across different cycles in the data dependence graph.

S510 is performed by a formula (12):

$$V2M(i, ii*\text{PE\_num}+j) \leq \sum_{b\in \text{L\_num,if } l2n[j][b]} E2L(a, (ii+1)\% II*\text{L\_num}+b) \quad (12)$$

where $l2n[j][b]$ &$G[a+V][i]$ & inner_dep_edge$[a]$ $\forall a \in E, \forall j \in \text{PE\_num}, \forall ii \in II, \forall i \in V$ where l2n[ ][ ] represents the second adjacency matrix for indicating a connection relationship between the input link and the processing element of the reconfigurable architecture.

S511 is performed by a formula (13):

$$\sum_{b\in \text{L\_num,if } l2n[j][b]} E2L(a, TS*\text{L\_num}+b) \leq \quad (13)$$
$$V2M(i, TS*\text{PE\_num}+j) + \sum_{c\in \text{L\_num,if } n2l[j][c]} E2L(a, (TS+1)\%\text{TS\_max}*\text{L\_num}+c)$$

where intra_dep_edge$[a]$ & graph$[a+V][i]$ $\forall a \in E, j \in \text{PE\_num}, TS \in \text{TS\_max}, i \in V$ where intra_dep_edge[ ] represents an edge that is a dependence within a cycle in the data dependence graph.

S512 is performed by a formula (14):

$$\sum_{b\in \text{L\_num,if } n2l[j][b]} E2L(a, (TS+1)\%\text{TS\_max}*\text{L\_num}+b) \leq \quad (14)$$
$$V2M(i, TS*\text{PE\_num}+j) + \sum_{c\in \text{L\_num,if } l2n[j][c]} E2L(a, (TS*\text{L\_num}+c)$$

where intra_dep_edge$[a]$ & graph$[i][a+V]$ $\forall a \in E, j \in \text{PE\_num}, TS \in \text{TS\_max}, i \in V.$ S513 is performed by a formula (15):

$$\sum_{b\in \text{L\_num,if } l2n[j][b]} E2L(a, ii*\text{L\_num}+b) \leq \quad (15)$$
$$V2M(i, ii*\text{PE\_num}+j) + \sum_{c\in \text{L\_num,if } n2l[j][c]} E2L(a, (ii+1)\% II*\text{L\_num}+c)$$

where inner_dep_edge$[a]$ & graph$[a+V][i]$ $\forall a \in E, j \in \text{PE\_num}, ii \in II, i \in V.$ S514 is performed by a formula (16):

$$\sum_{b\in \text{L\_num,if } n2l[j][b]} E2L(a, (ii+1)\% II*\text{L\_num}+b) \leq \quad (16)$$
$$V2M(i, ii*\text{PE\_num}+j) + \sum_{c\in \text{L\_num,if } l2n[j][c]} E2L(a, ii*\text{L\_num}+c)$$

where inner_dep_edge$[a]$ & graph$[i][a+V]$ $\forall a \in E, j \in \text{PE\_num}, ii \in II, i \in V.$ S515 is performed by a formula (17):

$$\sum_{b \in L\_num, if\ l2n[j][b]} E2L(a, ii*L_{num} + b) + V2M(i, ii*PE\_num + j) \le 1 \quad (17)$$

where graph$[a + V][i] == 0$ $\forall a \in E, \forall ii \in II, \forall j \in PE\_num, \forall i \in V.$ S516 is performed by a formula (18):

$$\sum_{\substack{b \in L\_num, \\ if\ l2n[j][b]}} E2L(a, ii*L\_num + b) + \sum_{\substack{b \in L\_num, \\ if\ l2n[f][b]}} E2L(c, ii*L\_num + b) \le \quad (18)$$

1 where $dst\_list[a] \ne dst\_list[c] \ \forall\ j \in PE\_num,$ $\forall ii \in II, \forall c \in E, \forall a \in E$ where dst_list[ ] represents a serial number of a processing vertex corresponding to each edge in the data dependence graph.

Figure 5:
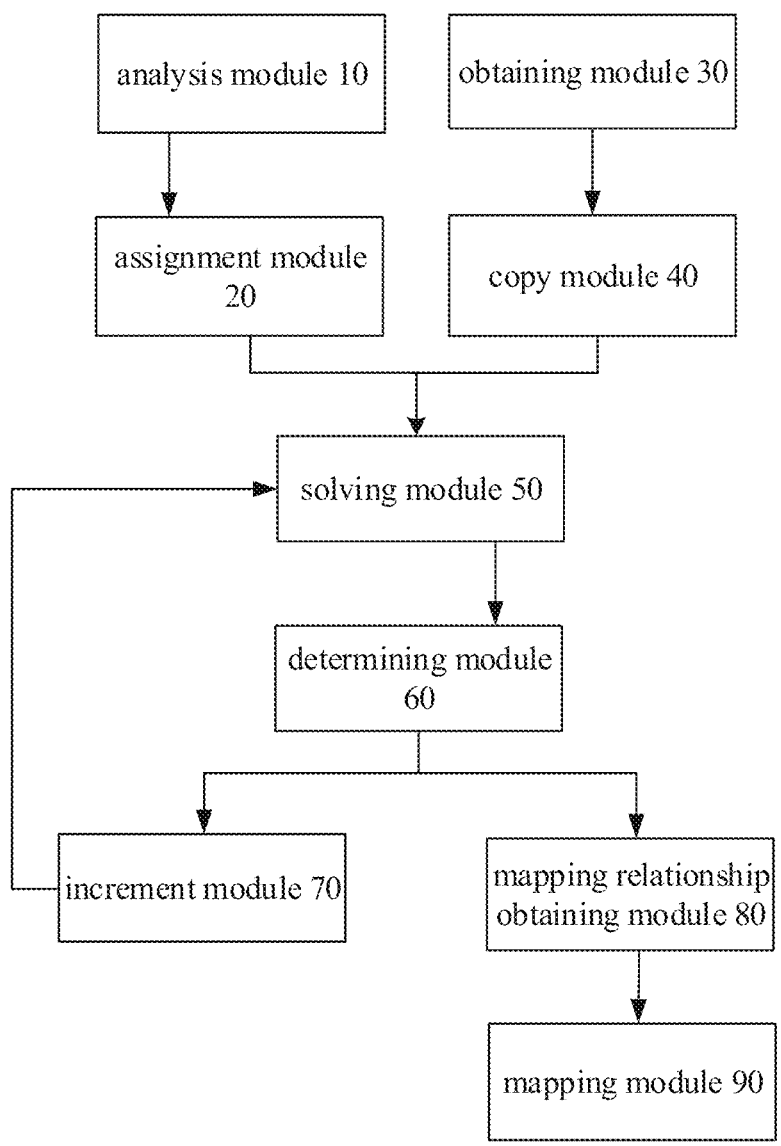
FIG. 5 is a block diagram of a mapping apparatus for a reconfigurable array according to an embodiment of the present disclosure.

As shown in FIG. 5, the present disclosure provides in embodiments a mapping apparatus for a reconfigurable array. The mapping apparatus includes:

an analysis module 10 configured to obtain a data dependence graph, and analyze the data dependence graph to obtain a maximum time step TS_max and a minimum initial interval;

an assignment module 20 configured to use the minimum initial interval as a start value of an initial interval;

an obtaining module 30 configured to obtain a reconfigurable architecture, wherein the reconfigurable architecture includes a processing element and a link, the link includes an output link and an input link, a relationship between the processing element and the output link is indicated by a first adjacency matrix, and a relationship between the input link and the processing element is indicated by a second adjacency matrix;

a copy module 40 configured to copy the first adjacency matrix and the second adjacency matrix to form a mapping space with a same number of layers as a value of the TS_max;

a solving module 50 configured to set a constraint condition to establish an integer linear programming model, and map, with the integer linear programming model, a processing vertex, an intra-cycle edge that is a dependence within a cycle, and an inter-cycle edge that is a dependence across different cycles of a circular structure in the data dependence graph, to the mapping space, respectively, wherein, in the integer linear programming model, the intra-cycle edge modulo the TS_max is performed, and the inter-cycle edge modulo the initial interval is performed;

a determining module 60 configured to determine whether the mapping between the data dependence graph which represents the cycle(s), and the reconfigurable architecture has a solution in the integer linear programming model;

an increment module 70 configured to add 1 to the initial interval, and input an increased initial interval to the solving module when it is determined by the determining module that the mapping has no solution;

a mapping relationship obtaining module 80 configured to obtain a mapping relationship from the processing vertex and the edge in the data dependence graph to the processing element and the link of extended TS_max layers when it is determined by the determining module that the mapping has a solution; and a mapping module 90 configured to generate configuration information by the mapping relationship modulo the initial interval, generate, according to the configuration information, a configuration file that is input to the reconfigurable architecture, and perform an operation by the reconfigurable architecture according to the configuration file.

The present disclosure provides in embodiments a mapping device for a reconfigurable array. The device includes a processor, and a memory having stored therein a computer program that, when executed by the processor, causes the processor to perform the present method as described above.

It should be noted that all of the above described features and advantages for the mapping method as described above are also applicable to the apparatus and the device, which will not be elaborated in detail herein.

The present disclosure provides in embodiments a non-transitory computer-readable storage medium having stored therein instructions that, when executed by a processor, are configured to perform the present method as described above.

It should be noted that various embodiments or examples described in the specification, as well as features of such the embodiments or examples, may be combined without conflict. Besides above examples, any other suitable combination should be regarded in the scope of the present disclosure.

Reference throughout this specification to "an embodiment", "some embodiments", "one embodiment", "another example", "an example", "a specific example" or "some examples" means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example" "in a specific example" or "in some examples" in various places throughout this specification are not necessarily referring to the same embodiment or example of the present disclosure. Furthermore, the particular features, structures, materials, or characteristics may be combined in any suitable manner in one or more embodiments or examples.

It should be noted that, in this context, relational terms such as first and second are used only to distinguish an entity from another entity or to distinguish an operation from another operation without necessarily requiring or implying that the entities or operations actually have a certain relationship or sequence. Moreover, "include", "include" or other variants are non-exclusive, thus a process, a method, an object or a device including a series of elements not only include such elements, but also include other elements which may not mentioned, or inherent elements of the process, method, object or device. If there is no further limitation, a feature defined by an expression of "include a . . . " does not mean the process, the method, the object or the device can only have one elements, same elements may also be included.

It should be noted that, although the present disclosure has been described with reference to the embodiments, it will be appreciated by those skilled in the art that the disclosure includes other examples that occur to those skilled in the art to execute the disclosure. Therefore, the present disclosure is not limited to the embodiments.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, which may not follow a shown or discussed order according to the related functions in a substantially simultaneous manner or in a reverse order, to perform the function, which should be understood by those skilled in the art.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system including processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium include but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs include one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A mapping method for a reconfigurable array, comprising steps:
   S1: obtaining a data dependence graph, and analyzing the data dependence graph to obtain a maximum time step count (TS_max) and a minimum initial interval;
   S2: using the minimum initial interval as a start value of an initial interval;
   S3: obtaining a reconfigurable architecture, wherein the reconfigurable architecture comprises at least one processing element and a corresponding link, the link includes an output link and an input link, a relationship between the processing element and the output link is indicated by a first adjacency matrix, and a relationship between the input link and the processing element is indicated by a second adjacency matrix;
   S4: copying the first adjacency matrix and the second adjacency matrix to form a mapping space with a same number of layers as a value of the TS_max;
   S5: setting a constraint condition to establish an integer linear programming model, and mapping, with the integer linear programming model, a processing vertex, an intra-cycle edge that is a dependency within a cycle of a circular structure in the data dependence graph, and an inter-cycle edge that is a dependence across different cycles of the circular structure in the data dependence graph, to the mapping space, respectively, wherein, in the integer linear programming model, the intra-cycle edge modulo of the TS_max is performed, and the inter-cycle edge modulo of the initial interval is performed;
   S6: determining whether the mapping between the data dependence graph which represents the cycles of the circular structure, and the reconfigurable architecture has a solution in the integer linear programming model, performing S8 if yes, and performing S7 if no;
   S7: adding 1 to the initial interval, and performing S5;
   S8: obtaining a mapping relationship from the processing vertex and the edge in the data dependence graph to the processing element and the link of extended TS_max layers; and
   S9: generating configuration information by the mapping relationship modulo of the initial interval, generating, according to the configuration information, a configuration file that is input to the reconfigurable architecture, and performing an operation by the reconfigurable architecture according to the configuration file.

2. The mapping method for the reconfigurable array according to claim 1, wherein the S5 comprises:
   S51: setting a first group of binary mapping variables and a second group of binary mapping variables, where the first group of binary mapping variables are mapping variables from each processing vertex in the data dependence graph to each processing element of the reconfigurable architecture, and the second group of binary mapping variables are mapping variables from each edge in the data dependence graph to each link, which are between and connecting each processing element, of the reconfigurable architecture;

S52: setting an objective function to minimize a number of the links used for the mapping;

S53: setting each processing vertex in the data dependence graph to be mapped to one processing element, setting one processing element of one layer configuration to map at most one processing vertex;

S54: setting one processing vertex in the data dependence graph to be only mapped to the processing element that performs the operation;

S55: setting each edge in the data dependence graph to be mapped to at least one link;

S56: setting one link of one layer configuration to map at most one edge;

S57: setting a first connectivity constraint for the intra-cycle edge, wherein the first connectivity constraint is such that when an $i^{th}$ processing vertex is mapped to a $j^{th}$ processing element, an edge connected from the $i^{th}$ processing vertex is mapped to a link connected from the $j^{th}$ processing element, where i and j are positive integers;

S58: setting a second connectivity constraint for the intra-cycle edge, wherein the second connectivity constraint ensures that when the $i^{th}$ processing vertex is mapped to the $j^{th}$ processing element, an edge connected to the $i^{th}$ processing vertex is mapped to a link connected to the $j^{th}$ processing element;

S59: setting a third connectivity constraint for the inter-cycle edge, wherein the third connectivity constraint is such that when the $i^{th}$ processing vertex is mapped to the $j^{th}$ processing element, the edge connected from the $i^{th}$ processing vertex is mapped to the link connected from the $j^{th}$ processing element, and a target solution of the third connectivity constraint is an edge indicating a dependency across different cycles in the data dependence graph and a modulo of the initial interval;

S510: setting a fourth connectivity constraint for the inter-cycle edge, wherein the fourth connectivity constraint ensures that when the $i^{th}$ processing vertex is mapped to the $j^{th}$ processing element, an edge connected to the $i^{th}$ processing vertex is mapped to a link connected to the $j^{th}$ processing element, and a target solution of the fourth connectivity constraint is an edge indicating a dependency across different cycles in the data dependence graph and a modulo of the initial interval;

S511: setting a first continuity constraint for the intra-cycle edge, wherein when the first continuity constraint is for the $j^{th}$ processing element, if the $i^{th}$ processing vertex has one $a^{th}$ input edge and the $a^{th}$ input edge is mapped to one input link of the $j^{th}$ processing element, the $i^{th}$ processing vertex is mapped to the $j^{th}$ processing element, or the $a^{th}$ input edge is simultaneously mapped to one output link of the $j^{th}$ processing element;

S512: setting a second continuity constraint for the intra-cycle edge, wherein when the second continuity constraint is for the $j^{th}$ processing element, if the $i^{th}$ processing vertex has one $a^{th}$ output edge and the $a^{th}$ output edge is mapped to one output link of the $j^{th}$ processing element, the $i^{th}$ processing vertex is mapped to the $j^{th}$ processing element, or the $a^{th}$ output edge is simultaneously mapped to one input link of the $j^{th}$ processing element;

S513: setting a third continuity constraint for the inter-cycle edge, wherein when the third continuity constraint is for the $j^{th}$ processing element, if the $i^{th}$ processing vertex has one $a^{th}$ input edge and the $a^{th}$ input edge is mapped to one input link of the $j^{th}$ processing element, the $i^{th}$ processing vertex is mapped to the $j^{th}$ processing element, or the $a^{th}$ input edge is simultaneously mapped to one output link of the $j^{th}$ processing element, and a target solution of the third continuity constraint is an edge indicating a dependency across different cycles in the data dependence graph and a modulo of the initial interval;

S514: setting a fourth continuity constraint for the inter-cycle edge, wherein when the fourth continuity constraint is for the $j^{th}$ processing element, if the $i^{th}$ processing vertex has one $a^{th}$ output edge and the $a^{th}$ output edge is mapped to one output link of the $j^{th}$ processing element, the $i^{th}$ processing vertex is mapped to the $j^{th}$ processing element, or the $a^{th}$ output edge is simultaneously mapped to one input link of the $j^{th}$ processing element, and a target solution of the fourth continuity constraint is an edge indicating a dependency across different cycles in the data dependence graph and a modulo of the initial interval;

S515: setting that if one edge in the data dependence graph is simultaneously mapped to one input link and one output link of one processing element, the processing element cannot map the processing vertex in the data dependence graph; and S516: setting one processing element of one layer configuration to map only one route.

3. The mapping method for the reconfigurable array according to claim 2, wherein the first group of binary mapping variables in S51 is set by a formula (1):

$$V2M\ (V,\ M),\ V=\text{the number of vertexes},\ M=PE\_num * TS\_max \qquad (1),$$

where V2M( ) represents a group of binary variables of a mapping relationship between processing vertexes in the data dependence graph and processing elements of the reconfigurable architecture, V represents a number of processing vertexes in the data dependence graph, M represents a number of processing elements of the mapping space after extension with the maximum time step count (TS_max,) and PE_num represents a number of processing elements of the reconfigurable architecture;

wherein the second group of binary mapping variables in S51 is set by a formula (2):

$$E2L(E,\ L),\ E=\text{the number of edges},\ L=\text{link\_num} * TS\_max \qquad (2),$$

Where E2L( ) represents a group of binary variables of a mapping relationship between edges in the data dependence graph and links of the reconfigurable architecture, E represents a number of edges in the data dependence graph, L represents a number of links of the mapping space after expansion with the maximum time step count (TS_max), and L_num represents a number of links of the reconfigurable architecture;

wherein the setting in S52 is performed by a formula (3):

$$obj = \text{Minimize} \left( \Sigma_{i \in L, i \in E} E2L(i,j) \right) \quad (3),$$

where obj represents the objective function; and wherein S53 is performed by a formula (4) and a formula (5):

$$\sum_{j \in M} V2M(i, j) = 1, \forall i \in V, \quad (4)$$

$$\sum_{i \in V} V2M(i, ii*PE\_num + j) \leq 1, \forall j \in PE\_num, \forall ii \in II. \quad (5)$$

4. The mapping method for the reconfigurable array according to claim 3, wherein S54 is aerformed by a formula (6):

$$\sum_{j \in M} support_{op(j)} * V2M(i, j) = 1, \forall i \in V, \quad (6)$$

where $support_{op(j)}$ represents a group of constraint matrices, indicating different types of processing elements, wherein in a constraint matrix indicating one type of processing elements, processing elements of this type are represented by a corresponding value of 1, and other processing elements are represented by 0;

wherein S55 is performed by a formula (7):

$$\sum_{b \in L} E2L(a, b) \geq 1, \forall a \in E; \quad (7)$$

and wherein S56 is performed by a formula (8):

$$\sum_{a \in E} E2L(a, ii*L\_num + b) \leq 1, \forall b \in L\_num, \forall ii \in II, \quad (8)$$

where L_num represents a number of the links of the reconfigurable architecture.

5. The mapping method for the reconfigurable array according to claim 4, wherein S57 is performed by a formula (9):

$$V2M(i, TS*PE\_num + j) \leq \sum_{b \in L\_num} E2L(a, (TS+1) \% TS\_max * L\_num + b) \text{ where } n2l[j][b] \ \&$$

$$intra\_dep\_edge[a] \ \forall a \in E, \forall TS \in TS\_max,$$

$$\forall j \in PE\_num, \forall i \in V, \quad (9)$$

where intra_dep_edge[ ] represents an edge that is a dependence within a cycle in the data dependence graph;

wherein S58 is performed by a formula (10):

$$V2M(i, TS*PE\_num + j) \leq \quad (10)$$

$$\sum_{b \in L\_num} E2L(a, TS*L\_num + b) \text{ where } l2n[j][b] \ \&$$

$$G[a + V][i] \ \&intra\_dep\_edge[a] \ \forall a \in E,$$

$$\forall TS \in TS\_max, \forall j \in PE\_num, \forall i \in V,$$

where TS represents a time step at which the processing vertex in the data dependence graph is executed, and intra_dep_edge[ ] represents an edge that is a dependence within a cycle in the data dependence graph;

wherein S59 is performed by a formula (11):

$$V2M(i, ii*PE\_num + j) \leq \quad (11)$$

$$\sum_{\substack{b \in L\_num, \\ if\ n2l[j][b]}} E2L(a, (ii+1) \% II * L\_num + b) \text{ where } n2l[j][b] \ \&$$

$$inner\_dep\_edge[a] \ \forall a \in E,$$

$$\forall j \in PE\_num, \forall ii \in II, \forall i \in V,$$

where n2l[ ][ ] represents the first adjacency matrix for indicating a connection relationship between the processing element and the output link of the reconfigurable architecture, G[ ][ ] represents an adjacency matrix for indicating a connection relationship between the processing vertex and the edge in the data dependence graph, and inner_dep_edge[ ] represents an edge that is a dependence across different cycles in the data dependence graph;

wherein S510 is performed by a formula (12):

$$V2M(i, ii*PE\_num + j) \leq \quad (12)$$

$$\sum_{\substack{b \in L\_num, \\ if\ l2n[j][b]}} E2L(a, ii*L\_num + b) \text{ where } l2n[j][b] \ \&$$

$$G[a + V][i] \ \&inner\_dep\_edge[a] \ \forall a \in E,$$

$$\forall j \in PE\_num, \forall ii \in II, \forall i \in V,$$

where l2n[ ][ ] represents the second adjacency matrix for indicating a connection relationship between the input link and the processing element of the reconfigurable architecture;

wherein S511 is performed by a formula (13):

$$\sum_{\substack{b \in L\_num, \\ if\ l2n[j][b]}} E2L(a, TS*L_{num} + b) \leq V2M(i, TS*PE_{num} + j) + \quad (13)$$

$$\sum_{\substack{c \in L\_num, \\ if\ l2n[j][c]}} E2L(a, (TS+1) \% TS\_max * L\_num + c)$$

-continued where $intra\_dep\_edge[a]$ &

$graph[a+V][i] \ \forall\, a \in E,\ j \forall\, PE\_num,\ TS \in$ $$TS\_max,\ \forall\, i \in V,$$

where $intra\_dep\_edge[\ ]$ represents an edge that is a dependence within a cycle in the data dependence graph;

wherein S512 is performed by a formula (14):

$$\sum_{\substack{b \in L\_num, \\ if\ l2n[j][b]}} E2L(a,\ (TS+1)\ \%\ TS\_max * L\_num + b) \leq \quad (14)$$

$$V2M(i,\ TS * PE_{num} + j) +$$

$$\sum_{\substack{c \in L\_num, \\ if\ l2n[j][c]}} E2L(a,\ TS * L\_num + c)$$

where $intra\_dep\_edge[a]$ &

$graph\ [i][a+V]\ \forall\, a \in E,\ j \in PE\_num,\ ii \in$ $$II,\ i \in V;$$

wherein S513 is performed by a formula (15):

$$\sum_{\substack{b \in L\_num, \\ if\ l2n[j][b]}} E2L(a,\ ii * L_{num} + b) \leq V2M(i,\ ii * PE_{num} + j) + \quad (15)$$

$$\sum_{\substack{c \in L\_num, \\ if\ l2n[j][c]}} E2L(a,\ (ii+1)\ \%\ II * L\_num + c)$$

where $inner\_dep\_edge[a]$ &

$graph\ [a+V][i]\ \forall\, a \in E,\ j \in PE\_num,\ ii \in$ $$II,\ i \in V;$$

and wherein S514 is performed by a formula (16):

$$\sum_{\substack{b \in L\_num, \\ if\ l2n[j][b]}} E2L(a,\ (ii+1)\ \%\ II * L_{num} + b) \leq \quad (16)$$

-continued $$V2M(i,\ ii * PE_{num} + j) + \sum_{\substack{c \in L\_num, \\ if\ l2n[j][c]}} E2$$

$L(a,\ ii * L\_num + c)$ where $inner\_dep\_edge[a]$ &

$graph\ [i][a+V]\ \forall\, a \in E,\ j \in PE\_num,\ ii \in$ $$II,\ i \in V.$$

6. The mapping method for the reconfigurable array according to claim 2, wherein S515 is performed by a formula (17):

$$\sum_{\substack{b \in L\_num, \\ if\ l2n[j][b]}} E2L(a,\ ii * L_{num} + b) + V2M(i,\ ii * PE_{num} + j) \leq 1 \quad (17)$$

where $graph[a+V][i] == 0\ \forall\, a \in E,$ $$\forall\, ii \in II,\ \forall\, j \in PE\_num,\ i \in V;$$

and wherein S516 is performed by a formula (18):

$$\sum_{\substack{b \in L\_num, \\ if\ l2n[j][b]}} E2L(a,\ ii * L\_num + b) + \quad (18)$$

$$\sum_{\substack{b \in L\_num, \\ if\ l2n[j][b]}} E2L(c,\ ii * L\_num + b) \leq 1$$

where $dst\_list[a] \neq dst\_list[c]\ \forall\, j \in PE\_num,$ $$\forall\, ii \in II,\ \forall\, c \in E,\ \forall\, a \in E,$$

where $dst\_list[\ ]$ represents a serial number of a processing vertex corresponding to each edge in the data dependence graph.

7. A mapping device for a reconfigurable array, comprising:
 a processor; and
 a memory having stored therein a computer program that, when executed by the processor, causes the processor to perform the method according to claim 1.

8. A non-transitory computer-readable storage medium having stored therein instructions that, when executed by a processor, are configured to perform the method according to claim 1.

* * * * *